United States Patent
Yasui et al.

(10) Patent No.: US 6,777,337 B2
(45) Date of Patent: Aug. 17, 2004

(54) PLANARIZING METHOD OF SEMICONDUCTOR WAFER AND APPARATUS THEREOF

(75) Inventors: Kan Yasui, Kodaira (JP); Souichi Katagiri, Kodaira (JP); Masayuki Nagasawa, Kawagoe (JP); Ui Yamaguchi, Urawa (JP); Yoshio Kawamura, Kokubunji (JP)

(73) Assignee: Renesas Technology Corporation, Tokyo (JP)

( * ) Notice: Subject to any disclaimer, the term of this patent is extended or adjusted under 35 U.S.C. 154(b) by 225 days.

(21) Appl. No.: 09/910,904

(22) Filed: Jul. 24, 2001

(65) Prior Publication Data

US 2002/0028581 A1 Mar. 7, 2002

(30) Foreign Application Priority Data

Jul. 27, 2000 (JP) ....................................... 2000-231389

(51) Int. Cl.[7] ....................... H01L 21/302; C09K 13/00; C09K 13/06
(52) U.S. Cl. ...................... 438/692; 252/79.1; 252/79.4
(58) Field of Search ......................... 438/692; 252/79.1, 252/79.4

(56) References Cited

U.S. PATENT DOCUMENTS

| 5,607,718 A | * | 3/1997 | Sasaki et al. ................. 427/97 |
| 5,733,819 A | | 3/1998 | Kodama et al. ............ 438/692 |
| 5,869,392 A | * | 2/1999 | Kimura ....................... 438/620 |
| 6,132,637 A | * | 10/2000 | Hosali et al. ............... 252/79.1 |
| 6,180,020 B1 | | 1/2001 | Moriyama et al. ............ 216/88 |

FOREIGN PATENT DOCUMENTS

| JP | WO97/10613 | 9/1995 |
| JP | 9-208933 | 12/1996 |
| JP | 2000-173955 | 12/1998 |

OTHER PUBLICATIONS

1999 Symposium on VSLI Technology, Digest of Technical Papers. pp. iii, xiv, 159–160.

* cited by examiner

Primary Examiner—Nadine G. Norton
Assistant Examiner—Lynette T. Umez-Eronini
(74) Attorney, Agent, or Firm—Reed Smith LLP; Stanley P. Fisher, Esq.; Juan Carlos A. Marquez, Esq.

(57) ABSTRACT

In a production process of a semiconductor device, planarizing of a wafer surface pattern can be performed to attain high planarity, good uniformity in the removal amount and improved controllability. This process include a step of planarizing a semiconductor wafer, from which at least two different films have been exposed, by polishing with a grindstone and a dispersant-containing processing liquid.

22 Claims, 10 Drawing Sheets

PLANARIZING METHOD OF SEMICONDUCTOR WAFER AND APPARATUS THEREOF

BACKGROUND OF THE INVENTION

1. Field of the Invention

The present invention relates to a planarizing method and apparatus thereof, in planarizing technique of a wafer surface pattern as made by polishing employed in the production process of a semiconductor device, to be achieved by using a grindstone as a polishing tool and an additive-containing processing liquid in order to attain polishing which features excellent flatness, excellent uniformity, high efficiency and large process margin.

2. Description of the Related Art

A semiconductor production process has a number of processing steps. Among them, a wiring step and a shallow trench isolation step which need wafer planarization done by polishing will be described with reference to FIGS. 2A to 5C.

Figure 2A:
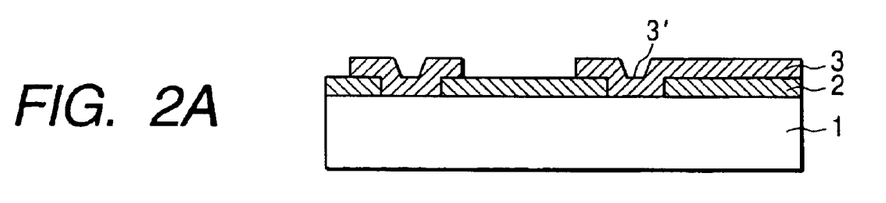
FIGS. 2A to 2C are schematic views of a wiring step without planarization.
Figure 2B:
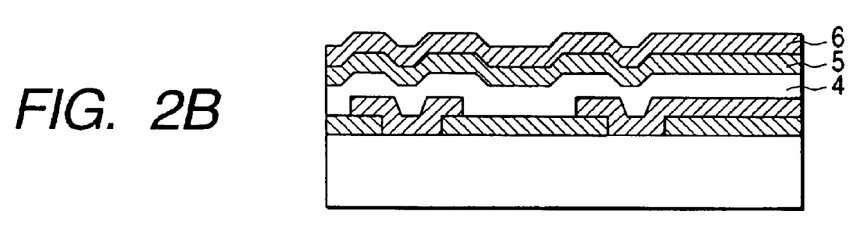
Figure 2C:
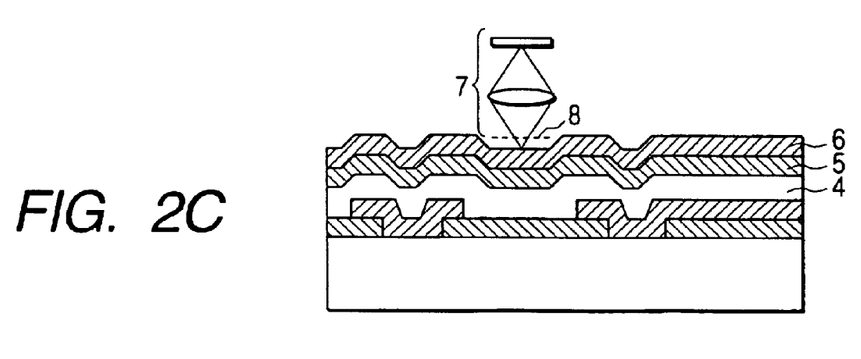

First, a wiring step will be described. FIG. 2A is a cross-sectional view of a wafer having a first wiring layer formed thereon. Over the surface of a wafer substrate 1 on which a transistor is to be formed, an insulating film 2 is formed. A wiring layer 3 made of aluminum or the like is disposed over the insulating film. Since a hole is opened in the insulating film 2 to ensure connection with the transistor, the portion 3' of the wiring layer is a little recessed. In a step of forming a second wiring layer as illustrated in FIG. 2B, an insulating film 4 and an aluminum layer 5 are formed over the first wiring layer, followed by deposition of a photoresist layer 6 for forming this aluminum layer into a wiring pattern. Then, as illustrated in FIG. 2C, the wiring pattern is transferred onto the photoresist layer 6 by exposure to light through a stepper 7. The concave and convex 8 on the surface of the photoresist layer 6 are not in focus simultaneously, which however depends on their step difference and in such a case, it causes serious disturbances such as defocus.

Figure 3A:
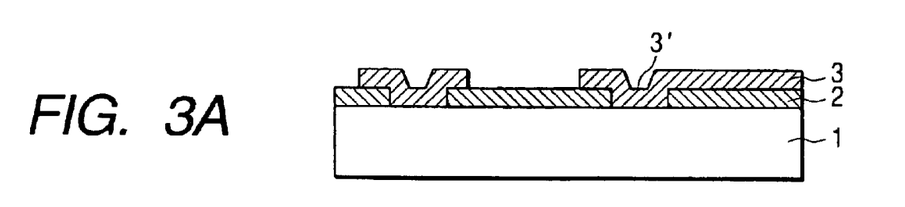
FIGS. 3A to 3D are schematic views of a wiring step including planarization.
Figure 3B:
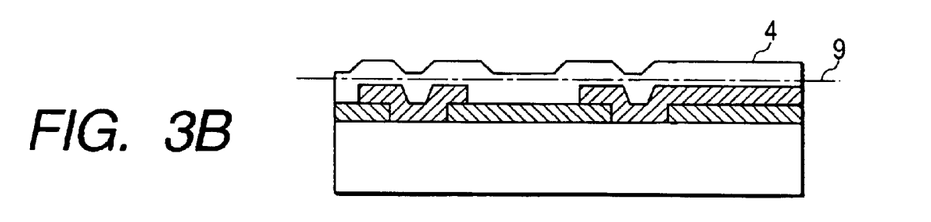
Figure 3C:
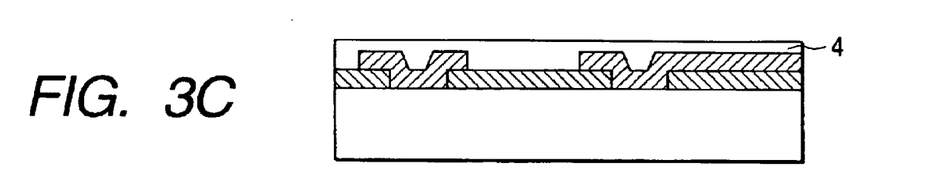
Figure 3D:
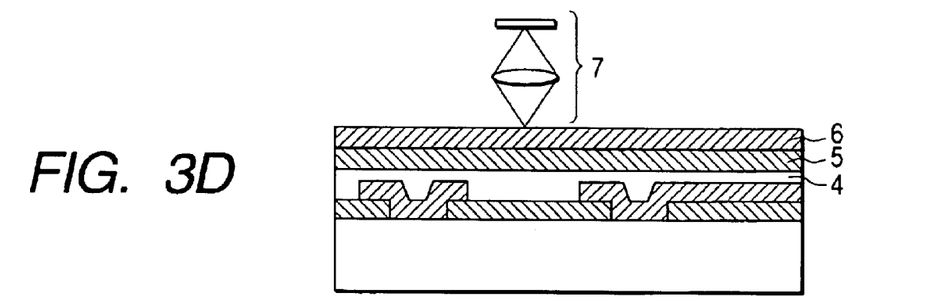

To overcome the above-described inconvenience, the wafer surface is planarized as will be described later. After forming the first wiring layer as illustrated in FIG. 3A, an insulating layer 4 is formed as illustrated in FIG. 3B and then, polishing is conducted to planarize the surface to the level of 9 in this diagram by the below-described method, whereby the state of FIG. 3C is obtained. A aluminum layer 5 and photoresist layer 6 are then overlaid, followed by exposure to light through a stepper as illustrated in FIG. 3D. The resist has a flat surface in this stage so that defocus as described above does not occur.

Figure 4A:
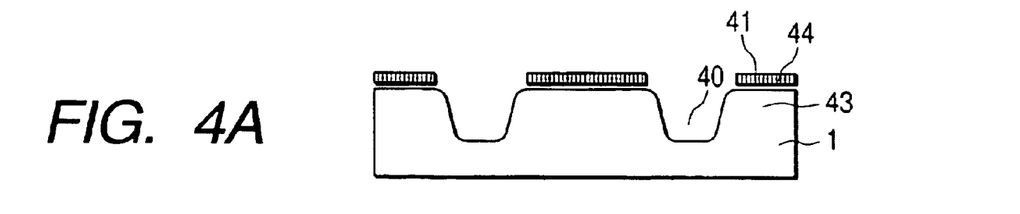
FIGS. 4A to 4D are schematic views of a shallow trench isolation step (the former half) using the related art.
Figure 4B:
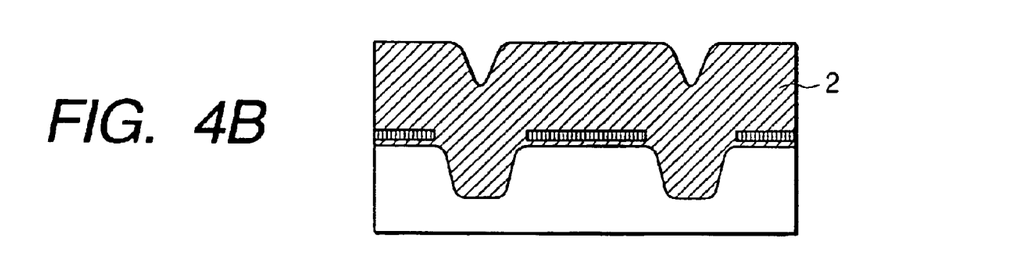
Figure 4C:
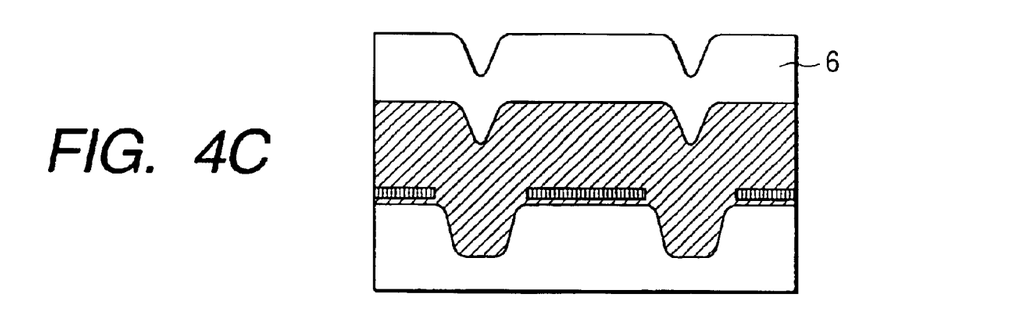
Figure 4D:
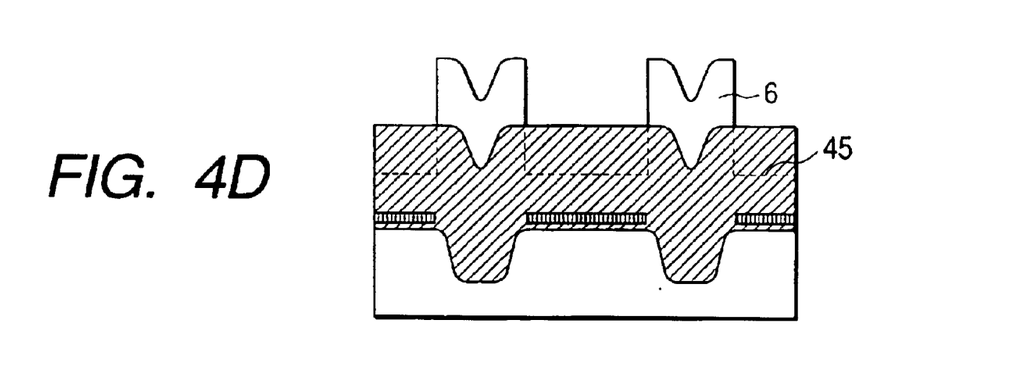
Figure 5A:
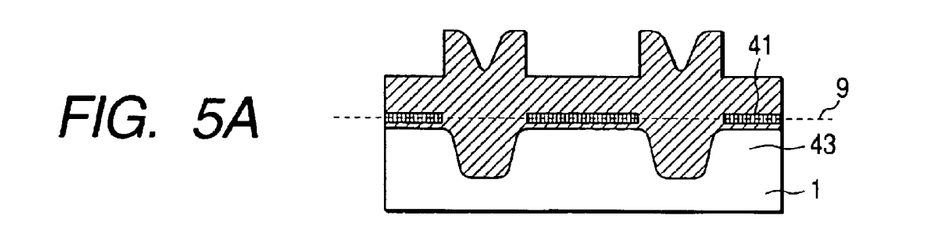
FIGS. 5A to 5C are schematic views illustrating a shallow trench isolation step (the latter half) using the related art.
Figure 5B:
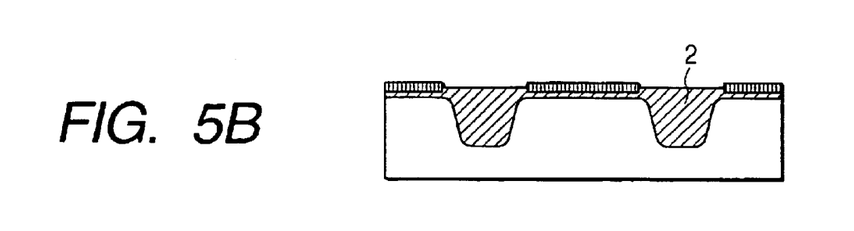
Figure 5C:
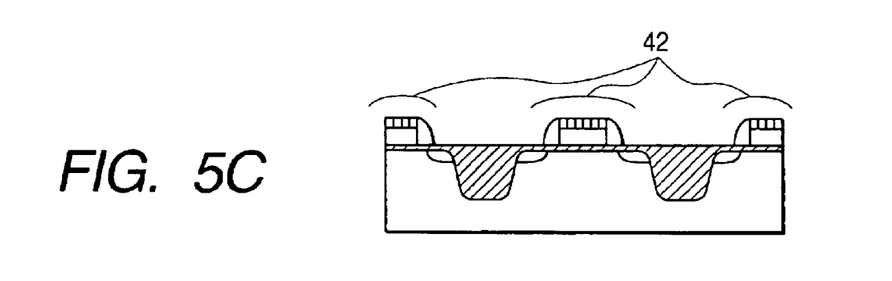

In the next place, the shallow trench isolation step will be described with reference to FIGS. 4A to 5C. This shallow trench isolation aims at insulation between elements on the substrate by embedding an insulating film in the shallow trench of the silicon substrate. FIG. 4A illustrates the deposition of a thin thermal oxide film 44 and a silicon nitride film 41 and then formation of a shallow trench 40 by dry etching both the upper films and the underlying silicon substrate. As illustrated in FIG. 4B, an insulating film 2 is embedded in the trench by CVD. Then, a photoresist layer 6 is disposed as illustrated in FIG. 4C. The photoresist 6 is left only at the trench portion as illustrated in FIG. 4D by lithography through a mask (reverse mask) obtained by negative-positive reversal of the mask used for formation of the shallow trench. With this photoresist 6 as a mask, dry etching is conducted to remove the insulating film 2 down to a predetermined depth 45, whereby the substrate as illustrated in FIG. 5A is obtained. Planarization polishing which will be described later is conducted to remove the insulating film 2 to the target level 9. The substrate becomes the state of FIG. 5B when polishing is conducted until complete removal of the insulating film 2 over the silicon nitride film 41. In FIG. 5B, the silicon nitride film 41 is thoroughly exposed and the insulating film 2 remains only in the shallow trench. By the subsequent steps, elements including transistor 42 are formed at the position from which the silicon nitride film 41 has been removed. With a view toward not deteriorating the characteristics of these elements, it is necessary to control the thickness of each of the silicon nitride film 41 and the insulating film 2 remaining in the shallow trench under markedly severe standards. To satisfy these standards, direct polishing is not conducted at the stage of FIG. 4B but steps FIG. 4C to FIG. 5A for relieving the polishing load are added.

Figure 6:
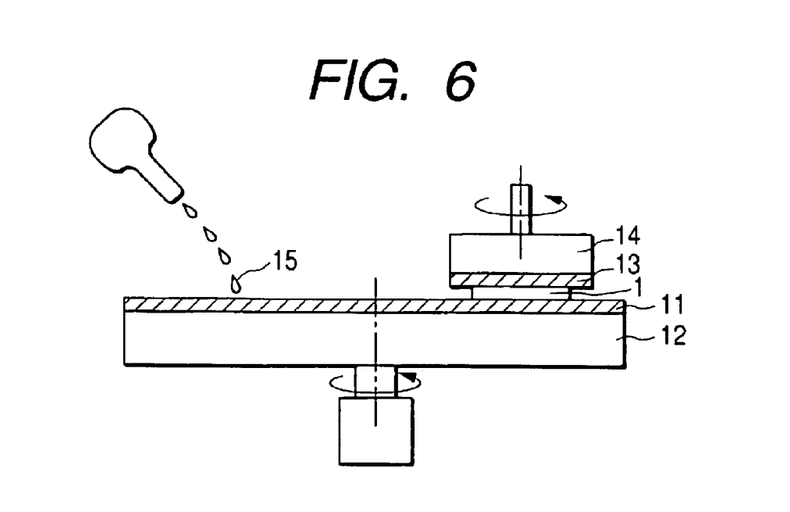
FIG. 6 is a view illustrating a chemical mechanical polishing (CMP)

A description will next be made of a planarization method employed for the above-described step. FIG. 6 illustrates CMP (chemical mechanical polishing) which is one of the most popularly employed methods. A polishing pad 11 adhered onto a platen 12 is turned. This polishing pad is, for example, polyurethane sliced into a thin sheet. A wafer 1 to be processed is fixed to a wafer holder 14 via an elastic backing pad 13. The convex portion of the insulating film 4 on the wafer surface is planarized by applying a load on the surface of the polishing pad 11 while turning this wafer holder 14 and feeding a polishing slurry 15, which is a processing liquid containing abrasive grains, onto the polishing pad 11.

Figure 1:
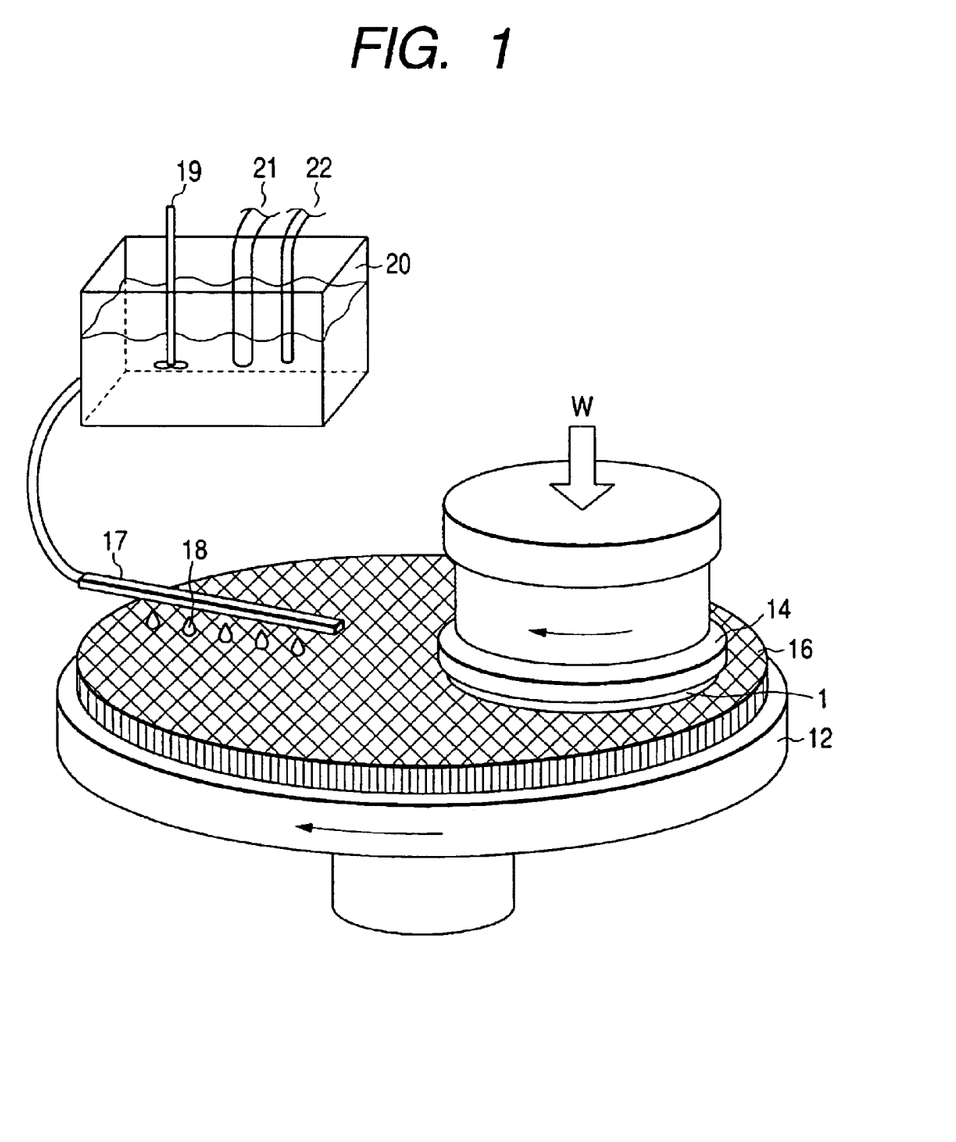
FIG. 1 is a schematic view of a planarizing method using a grindstone according to an embodiment of the present invention.

As a processing technique superior to the above-described CMP in planarity, disclosed in Patent Application No. PCT/JP95/01814 is a planarizing technique using a grindstone. FIG. 1 illustrates a planarizing method by using a grindstone. An apparatus used for this technique is basically similar to that employed for CMP (chemical mechanical polishing) using the above-described polishing pad but it features that a grindstone 16 containing abrasive grains such as cerium dioxide is installed, instead of a polishing pad, onto a rotary platen 12. Planarization can be conducted only by supplying, as a processing liquid 18, abrasive-grain-free deionized water which corresponds to fumed silica in CMP. This method using a grindstone is excellent in planarizing the step difference of a pattern and is able to completely planarize a large-size pattern, for example, a pattern of several mm in width, which cannot be attained by the conventional method. Use of a grindstone high in a using efficiency of abrasive grains instead of an expensive polishing slurry low in a using efficiency of abrasive grains enables a cost reduction. With regards to scratches presumably caused by the adoption of a grindstone, it is possible to prevent even scratches, which are too small to be observed by naked eyes, by using abrasive grains one figure finer than those ordinarily employed for a grindstone. Described specifically, ultrafine abrasive grains having an average particle size of 0.2 to 0.3 μm and a maximum particle size of 2 μm, preferably 99% of which have a particle size of 1 μm or less are used. By fine division of abrasive grains happens to lower a removal rate, but use of an additive as shown in Japanese Patent Unexamined Publication No. 2000-173955 makes it possible to positively release abrasive grains from a grindstone and improve a removal rate.

Problems of the above-described CMP method and the processing method using a grindstone will next be described in this order.

In the CMP (chemical mechanical polishing) method, the planarizing capacity is insufficient because a polishing pad has not a high modulus of elasticity. Since the polishing pad is brought into contact with not only the convex portion but also the concave portion and a load is applied thereon upon processing, the size of a pattern which can be planarized is several mm in width at maximum. It is very difficult to planarize patterns, such as DRAM, formed on a cm order. For the similar reason, even in a shallow trench isolation step, a soft polishing pad excessively polishes and removes an insulating film in the shallow trench and this phenomenon (dishing) deteriorates the characteristics of elements. As a countermeasure, ordinarily employed is a process of conducting lithography using a reverse mask and removing the convex portion by dry etching in advance, thereby lowering the polishing load. This countermeasure increases the number of the steps and in addition, planarity is not satisfactory yet. In addition, the polishing slurry used for CMP is accompanied with the problems that a special care must be taken because a polishing slurry tends to contain an acid or alkali; and abrasive grains in the slurry tend to scatter and induce an increase of particle residues in a clean room.

As a method for overcoming the above-described problems of CMP, proposed is processing using a grindstone instead of the polishing pad and slurry. The modulus of elasticity of the grindstone is about one figure higher than that of a polishing pad so that shortage of planarity can be overcome. By adoption of this method, a wide convex on the cm order can be planarized in a wiring step, while in an element isolation step, planarity is so high as to carry out processing with less dishing even if a reverse mask is not used. In addition, this method does not use slurry, which permits easy handling and suppression of an increase in the residual of scattered abrasive grains. When a grindstone is employed, on the other hand, the following problems will occur.

The processing method using a grindstone involves a problem in the trade-off between planarity and uniformity. In general, as the modulus of elasticity increases by changing a processing tool from a polishing pad to a grindstone, the higher the planarity of the convex, but the uniformity in the removing amount on the wafer deteriorates. This is because a processing tool having a high modulus of elasticity such as grindstone selectively removes the convex having a slight difference in pressure so that it is apt to be influenced by minute unevenness on the substrate or irregular pressure upon processing.

As described above, CMP and processing with a grindstone have not yet been free from the problems, that is, insufficient planarity and insufficient uniformity, respectively.

In addition, they have, as a common problem, a shortage in the process margin upon completion of the shallow trench isolation step. In the shallow trench isolation step as illustrated in FIGS. 4A to 4D or FIGS. 5A to 5C, it is necessary to control, with good precision, the remaining thickness of the nitride film 41 for protecting an active region and the remaining film thickness in the element isolating shallow trench 40, because these remaining films require very delicate treatment. When removal is not enough, the remaining insulating film over the nitride film or extra insulating film protruding from the shallow trench deteriorate the characteristics of the device. Excessive removal on the other hand damages the active area or causes insulation failure at the shallow trench isolation portion. Ideally, polishing is completed when the surface of the nitride film 40 is completely exposed at any point on the wafer. In reality, time ensuring a sufficient polishing amount all over the surface of the wafer is markedly short and the terminal point of polishing cannot be detected easily even by using some means. With a view to overcoming this problem, proposed in Japanese Patent Unexamined Application No. 9-208933 is a method using, in CMP, silicon nitride fine particles and an acid as a polishing agent, thereby increasing a removal rate selectivity ratio of a silicon dioxide film relative to a silicon nitride film. In this method, however, there still remains a problem that high planarity cannot be attained because of a low modulus of elasticity of the polishing pad. For example, in the shallow trench isolation step, even if a selectivity ratio is high, a soft polishing pad is brought into contact with the central portion of the shallow trench more strongly than the other portion so that excessive polishing of the film at the center of the shallow trench inevitably occurs, thereby forming a dishing. In addition, this method employs an acid so that some countermeasures against corrosion of a metal film, if any, or an apparatus are necessary.

SUMMARY OF THE INVENTION

The present invention is made to overcome the above-described problems by adding a dispersant to a processing liquid in a grindstone-using planarizing method of a wafer surface pattern.

There are some types of dispersants suitable for this planarizing method. A dispersant which intensively acts on the interface between a processing liquid and abrasive grains or a film to be processed such as a surfactant is most effective. Such a dispersant exists mainly on the interface between abrasive grains and a processing liquid, prevents agglomeration of abrasive grains owing to electric repulsive power or steric hindrance effect by its molecular shape, thereby heightening dispersity. The dispersant properly used in combination with a hydrophilic group or a hydrophobic group selectively adsorbs to a film to be processed and acts on the film. It concentrates on the interface so that even a trace amount of it is effective. Ordinarily employed surfactants tend to contain an alkali metal such as sodium and adversely affect a semiconductor device so that they are not suited. Neither are those containing a heavy metal as an impurity. In addition, dispersants which are safe and have less influence on the environment are desired, because they are used for mass production in a plant. As a dispersant which can satisfy the above-described limitations and can well disperse inorganic oxide fine particles serving as abrasive grains, dispersants made of a polycarboxylate can be mentioned as an example. Sodium salts of it are ordinarily employed, but ammonium salts are suited in consideration of the influence on a semiconductor. Among the polycarboxylates, ammonium polyacrylate is especially preferred.

When a grindstone having inorganic fine particles as raw material abrasive grains is employed, ammonium polyacrylate preferred as a dispersant is particularly effective. More specifically, when inorganic fine particles made of cerium dioxide, aluminum oxide, silica, zirconium oxide, manganese oxide, titanium oxide or magnesium oxide, or a mixture thereof are used as abrasive grains, ammonium polyacrylate has high dispersing effect, thereby bringing about a high removal rate and a high-quality surface. In addition, adhesion property of ammonium polyacrylate differs between a silicon nitride film and a silicon oxide film, resulting in an improvement in the removal selectivity ratio of two these films.

A dispersant having, as well as the above-described effects, abrasive grain dispersing effect or selective adsorbing property to a film to be processed is usable in the present invention. A dispersant capable of changing the surface potential of the abrasive grains generates repulsion between abrasive grains, thereby heightening the dispersity. At the same time, selective adsorption of a dispersant onto the surface of a film to be processed causes a change in the surface potential (zeta potential serves as an index) which varies, depends on the kind of the film, thereby bringing about a change in a removal selectivity ratio. Adjustment of the pH of the processing liquid to alkali is effective for causing the film surface and the surface of the abrasive grains to have a zeta potential of equal polarity, allowing repulsion to work and heightening the dispersity. Ammonia or an ammonium salt is preferably added for this purpose. Similarly, surfactants acting on the interface between the abrasive grains and processing liquid, thereby changing the zeta potential are effective as the dispersant of the present invention.

Polycarboxylates other than the above-described ammonium polyacrylate are also effective for dispersion of abrasives or selective adsorption to a film to be processed so that they are also suited as the dispersant of the present invention. Polycarboxylates such as acrylate and maleate are particularly effective as the dispersant. In addition to the polycarboxylates, dispersants such as polyoxyethylene derivatives, phosphate condensates, lignin sulfonates, aromatic sulfonate formalin condensates and alkylamines are also effective.

The above-exemplified dispersant has bring about marked effects when added to a grindstone made of finely divided abrasive grains for a semiconductor. It is particularly effective for a grindstone formed of abrasive grains which have an average particle size of 0.2 to 0.3 $\mu$m and at least 99% of which have a maximum particle size of 1 $\mu$m or less.

The particle size of the abrasive grains is very fine so it is measured by laser light scattering method or electron microscopy. Laser light scattering method capable of measuring a number of particles has less diversity but measuring error appears when nonspherical particles or weakly agglomerated particles are measured. Measurement by electron microscopy, on the other hand, can correct errors due to particle shape or agglomeration, but has diversity because the number of particles which can be measured is small. The abrasive grains effective in the present invention has a particle size, as an average of the particles measured, of 0.1 to 0.4 $\mu$m and at least 99% of the particles have a particle size of 1 $\mu$m or less. The size of the particles in a nonspherical form is expressed by (the longest diameter+the shortest diameter)/2. Upon laser light scattering method, agglomeration happens to appear owing to the pretreatment of a measuring instrument or of a sample and in such a case, a large number of particles having a particle size of 1 $\mu$m or greater seem to exist. This must be taken into consideration upon measurement. If no agglomeration due to pretreatment occurs, abrasive grains which have an average particle size, among the particles measured, of 0.2 to 0.3 $\mu$m and at least 99.9% of which have a particle size of 1 $\mu$m or less as a result of laser light scattering method are effective in the present invention.

Depending on the hardness of abrasive grains, kind of a film to be processed or a step, abrasive grains having a particle size outside the above-described range may be used. The abrasive grains having an average particle size, among particles measured, within a range of 0.05 to 0.5 $\mu$m, preferably 0.1 to 0.4 $\mu$m are effective. In terms of the maximum particle size (the maximum particle size of 99% or 99.9% of the particles), abrasive grains of 2 $\mu$m or less, more preferably 1 $\mu$m or less are preferred. There is no limitation on the minimum particle size in principle, but abrasive grains having a particle size of 0.001 $\mu$m or greater is practically employed.

DETAILED DESCRIPTION OF THE PREFERRED EMBODIMENTS

A description will next be made of an embodiment of the present invention. The basic constitution of an apparatus will next be described based on FIG. 1. The apparatus is formed of a grindstone 16, a polishing platen 12 which rotates with the grindstone adhered thereto, a wafer holder 14 and a polishing liquid supply unit 20. The grindstone 16 and polishing platen 12 each rotates by a motor which is not illustrated. A wafer 1 is supported by the wafer holder 14 with its surface directed to the grindstone 16. During polishing, the back side of the wafer is pressed against the grindstone 16 under uniform pressure. The grindstone 16 and wafer holder 14 undergo rotary motion during processing. They are set to have substantially the same rotational frequency. The speed of the wafer 1 supported by the wafer holder 1 is almost equal relative to the speed of the grind stone at any point on the wafer so that the whole surface of the wafer is uniformly polished. As abrasive grains constituting the grindstone, cerium dioxide is selected because it does not easily make scratches, permits a high removal rate and, when a dispersant is added, improves selectivity.

As a processing liquid 18, a liquid obtained by adding a dispersant to deionized water is employed in the present invention. In the polishing liquid supply unit 20, deionized water and the dispersant are fed from a deionized water supply port 21 and a dispersant supply port 22, respectively. After being stirred by a stirrer 19, the mixture is fed onto the grindstone 16 through the polishing liquid supply port 17. In this embodiment, the dispersant is mixed with deionized water in the polishing liquid supply unit attached to the processing apparatus. Alternatively, a processing liquid having a dispersant already mixed therein may be used.

Figure 7:
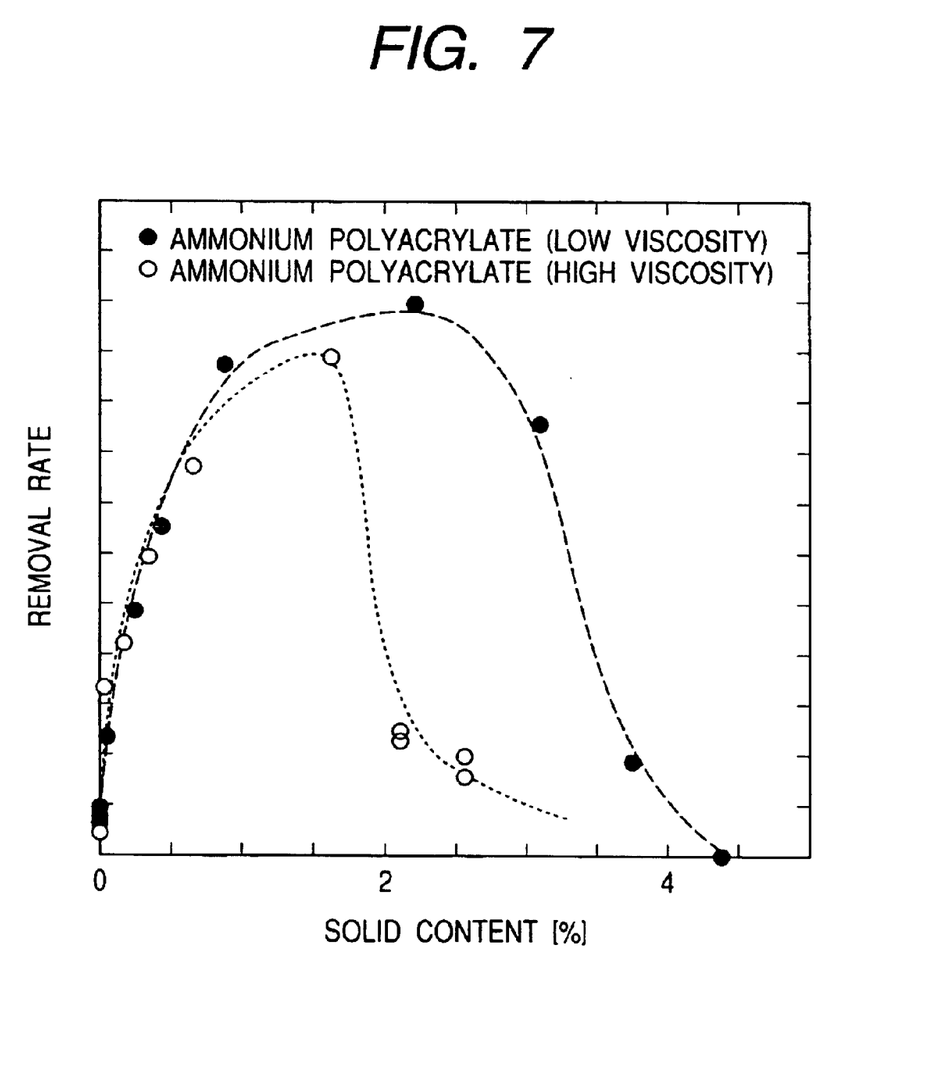
FIG. 7 is a view of the effect of a dispersant for a removal rate in the embodiment.

In this embodiment, as a dispersant, ammonium polyacrylate, among polycarboxylates, was employed. FIG. 7 illustrates a removal rate of a silicon dioxide film when ammonium polyacrylate is used. In this graph, the amount of ammonium polyacrylate in terms of solid content by weight is plotted along the abscissa, while a relative value of a removal rate is plotted along the ordinate. Although the optimum amount depends on the kind of the grindstone (abrasive grains, particle size, kind of the binder resin, pore size) or molecular weight of ammonium polyacrylate, it falls within a range of 0.05 wt. % to 5 wt. %. By the addition of ammonium polyacrylate having a solid content of 1 wt. % and a molecular weight of 10000, the removal rate of a silicon dioxide film increases by about 10 times compared with the case where no ammonium polyacrylate is added.

The amount of ammonium polyacrylate permitting appearance of a removal rate improving effect differs with its molecular weight. The filled dot in FIG. 7 represents a removal rate when a low-viscosity ammonium polyacrylate having a molecular weight of about 10000 is added, while an open dot represents a removal rate when a high-viscosity ammonium polyacrylate having a molecular weight of about 140000 is added. Although certain effects are available at either of them, the former one is preferred because at a molecular weight of 10000, the removal rate improving effect is available at a wide range of concentration. From the viewpoint of handling ease, ammonium polyacrylate having a lower molecular weight is preferred for low viscosity. Adsorption property lowers at a molecular weight less than 100, so that of 100 or greater is suited. At a molecular weight exceeding 200000, on the other hand, thickening occurs and an agglomeration effect appears. So that of 200000 or less is preferred. In short, a molecular weight falling within a range of 100 to 200000 is suited. Molecular weights ranging from 3000 to 40000 are most suited, because ammonium polyacrylate having a molecular weight this range has a high dispersing effect.

Figure 8:
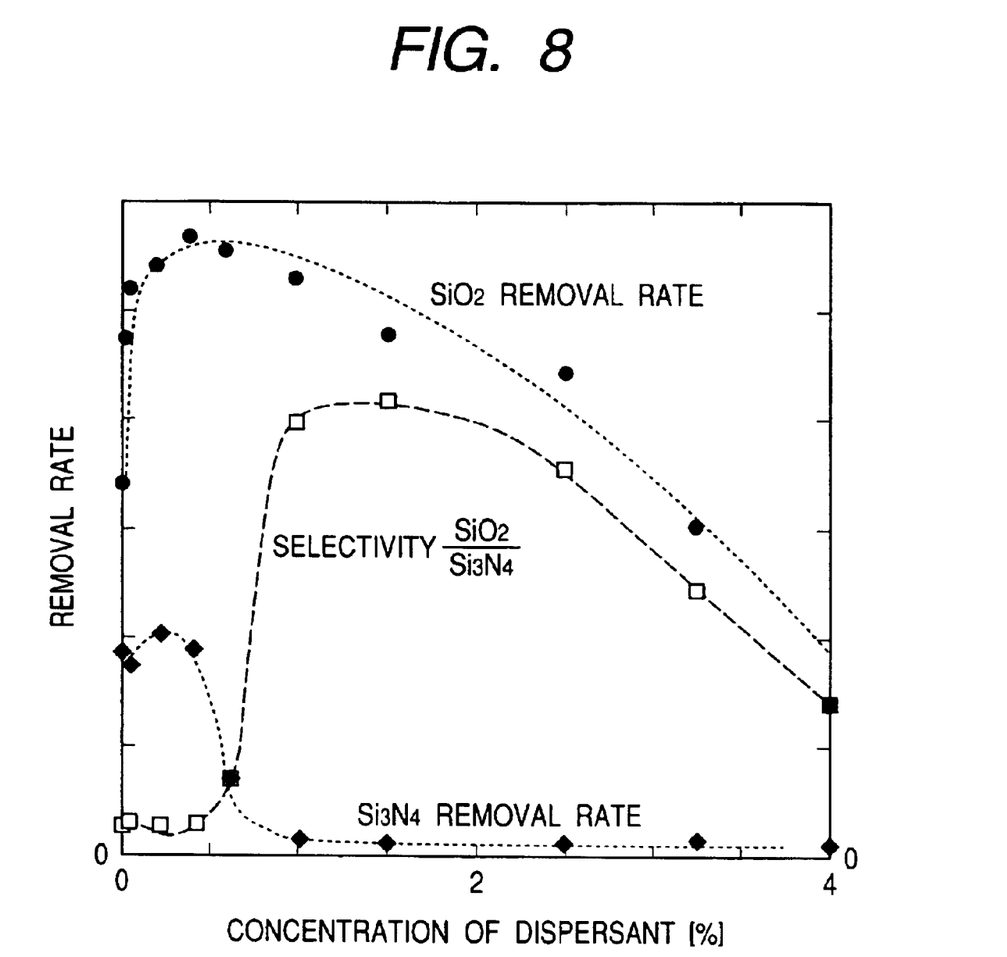
FIG. 8 is a view of the effect of a dispersant for improving selectivity in the embodiment.

In FIG. 8, illustrated are removal rates of a silicon dioxide ($SiO_2$) film and a silicon nitride ($Si_3N_4$) film and a selectivity obtained by dividing the former by the latter when ammonium polyacrylate is employed. A high removal rate selectivity ratio exceeding 20 is attained by two effects, that is, improvement of a removal rate of a silicon dioxide film and a drastic decrease of a removal rate of a silicon nitride film, each by the addition of a dispersant. Addition of ammonium polyacrylate in an amount of 1 wt. % or greater in terms of a solid content is effective for a high selectivity ratio. A higher selectivity ratio facilitates attainment of a desired polishing amount by using a low-removal-rate film as a stopper, whereby uniformity of the processing amount on the wafer can be improved easily.

The productivity can be heightened more by changing the concentration of the additive during processing. When ammonium polyacrylate is employed under the conditions of FIG. 8, its concentration permitting the highest removal rate is 0.5%, but that permitting the highest selectivity is 2%. There exists a difference between these two. By polishing at an ammonium polyacrylate concentration of 0.5% at the initial stage requiring a high removal rate, and then, lowering the concentration to 2% at a stage near completion of the polishing, selectivity can be improved. By making use of the thus obtained stopper film, both the uniformity in the polishing amount and controllability of the terminal point of polishing can be attained.

Figure 9:
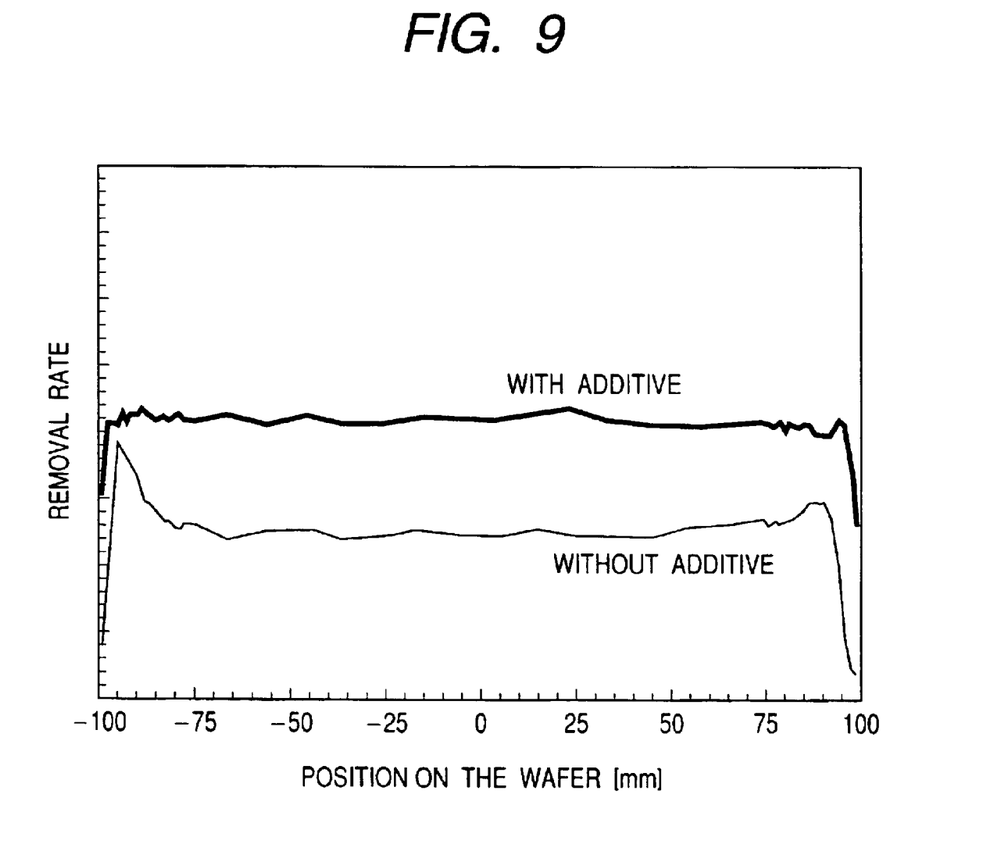
FIG. 9 is a view of illustrating effect of a dispersant for improving uniformity of a polishing amount in embodiments.

Even if a film to be polished was homogeneous, addition of a dispersant improves the uniformity of the processing amount as described below. FIG. 9 illustrates comparison of distribution of a removal rate of a silicon dioxide film on a wafer between presence and absence of ammonium polyacrylate as a dispersant. The position on the diameter of a wafer is plotted along the abscissa, while a removal rate is plotted along the ordinate. In the case of additive-free polishing, the periphery of the wafer is over polished, showing inferior uniformity. When a dispersant is added, polishing amount distribution on the wafer, even at the periphery, is almost uniform.

In this embodiment, cerium dioxide which is suited for the processing of a silicon dioxide film and exhibits a high selectivity relative to a silicon nitride film by the addition of a dispersant is used as abrasive grains constituting a grindstone. The grindstone is obtained by fixing the abrasive grains with a resin, while forming fine pores. The purity of the abrasive grains is 99.9% or greater and the content of alkali metals and halogens harmful for a semiconductor is several ppm or less. Defects such as micro-scratches which are too small to observe by naked eyes but are harmful for a semiconductor are prevented by using abrasive grains at least one figure finer than the ordinarily employed ones. The particle size of the abrasive grains is 0.2 to 0.3 $\mu$m on average and at least 99% of the whole particles have the maximum particle size of 1 $\mu$m or less. Agglomeration of abrasive grains or reduction in the removal rate due to the use of fine abrasive grains can be suppressed by the addition of a dispersant. As a result, it is possible to simultaneously attain high planarizing capacity, high removal rate and high selectivity, while suppressing generation of defects.

Figure 10A:
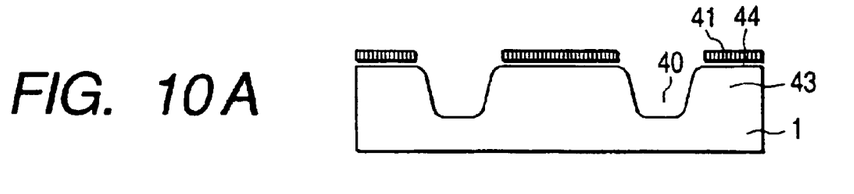
FIGS. 10A to 10D are schematic views illustrating a shallow trench isolation step simplified by the application of the present invention.
Figure 10B:
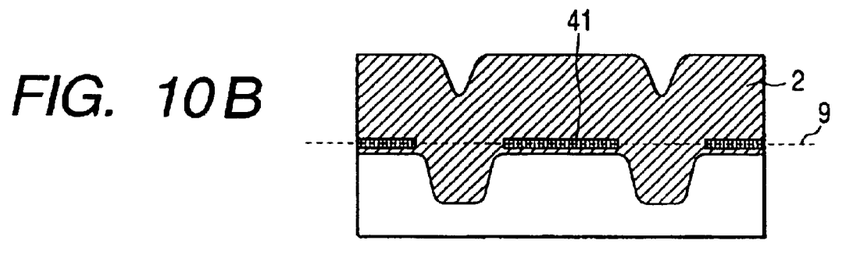
Figure 10C:
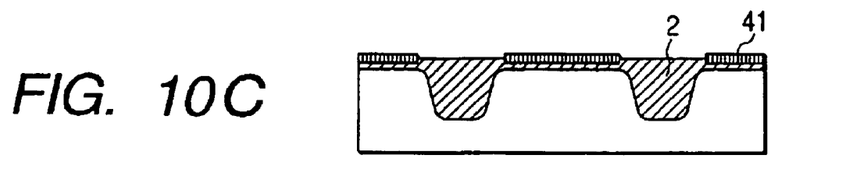
Figure 10D:
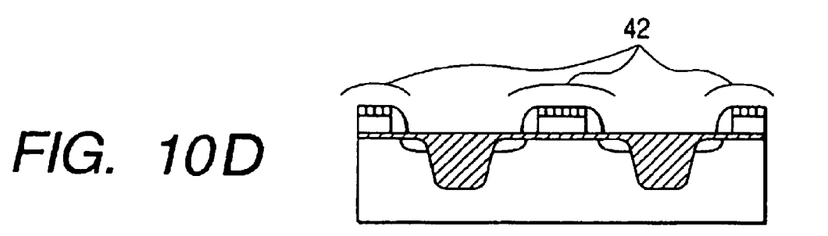

With reference to FIGS. 10A to 10D, a description will next be made of a production process of a semiconductor device to which the above-described apparatus and optimized processing conditions have been applied. Here, described is an application example of the present invention to an element isolation step. FIG. 10A illustrates the step of depositing a thin thermal oxide film 44 and a silicon nitride film 41, and then forming a shallow trench 40 by dry etching these films and silicon substrate lying therebelow. An active region 43 over which an element is to be formed is protected by a nitride film 41. An insulating film 2 is then embedded in the trench by CVD as illustrated in FIG. 10B. The above-described present invention is applied to this stage, whereby planarization is conducted down to the level 9 of FIG. 10B to completely expose the silicon nitride film 41 and remove the extra insulating film outside the shallow trench 40 as illustrated in FIG. 10C. In this Example, it is possible to completely expose the all the portions of the silicon nitride film 41 from the wafer surface and to leave only a predetermined amount of the insulating film 2 in the shallow trench at the stage of FIG. 10C. On the portions from which the silicon nitride film 41 has been removed, elements such as transistors 42 are then formed as illustrated in FIG. 10D. In order not to deteriorate the characteristics of these elements, it is necessary to control the thickness of each of the silicon nitride film 41 and the insulating film 2 remaining in the shallow trench under markedly severe standards. The related art, as illustrated in FIGS. 4A to 4D and 5A to 5C, needs steps of lithography using a reverse mask and dry etching to satisfy these standards. In the present invention, however, the above-described standards can be satisfied even without these steps, because high planarity is attained by the use of a grindstone; a high removal rate selectivity ratio enables the silicon nitride film to serve as a polish stop layer, leading to an improvement in uniformity; and a process margin at a terminal point can be secured.

The present invention can be applied to the planarizing step of an insulating film between wiring layers which were described in the section of the related art.

Effects available by the present invention will next be described after classification of them into an improvement of selectivity which is a main effect, effect derived therefrom and the other effect.

First, a selectivity improving effect will be described. As illustrated in FIG. 8, use of ammonium polyacrylate and a grindstone made of cerium dioxide abrasive grains in combination markedly improves a removal rate selectivity ratio of a silicon dioxide film relative to a silicon nitride film. This selectivity ratio is 3 or less when an additive is not used, but it increases to 20 or greater by using it. This means that etching difficulty of the silicon nitride film is at least 20 times greater than that of the silicon dioxide film and in such a case, the nitride film can be used as a polish stop layer. Owing to the function of the nitride film as a stopper, uniformity can be improved by excessive polishing (over etching). Even after the whole portion of the silicon dioxide film over the wafer surface including the portion which has not yet been etched owing to etching delay is removed by polishing, the silicon nitride film can be left sufficiently. In addition, use in combination with a grindstone having excellent planarity makes it possible to prevent generation of dish-like excessive polishing, which is called dishing, in the shallow trench portion for element isolation even during over polishing. This means that both planarity and uniformity can be attained by overcoming the drawback of a grindstone having excellent planarity but a problem in uniformity. High-level coexistence of planarization and uniformity is an effect brought for the first time by using a grindstone and a dispersant in combination. In addition, owing to an extremely low removal rate of the nitride film, it is possible to carry out over-polishing without severe time control, which brings about an effect for increasing a margin for controlling the terminal point of the removal.

A change in selectivity due to the addition of a dispersant is presumed to occur because the particles of the dispersant adsorb to a selected film (1999 Symposium on VLSI Tech., B-3). For example, in the case of a surfactant type dispersant having both a hydrophilic group and a hydrophobic group, the hydrophilic group and hydrophobic group exist on the interface therebetween, while the former turns to the side of the processing liquid and the latter adsorbs to the film side. Since the sorbability to the surface of a film differs with the property of the hydrophobic group, the adsorption amount of the dispersant differs with the film when the different kinds of the films exist. Since the length of one molecule adsorbed to a film is very long when a high molecule such as ammonium polyacrylate is used as a dispersant, a film having a thickness of the high molecule is formed on the interface and molecular adsorption happens to disturb polishing. Accordingly, by the addition of such a dispersant, a removal rate selective ratio changes with the film. Not only ammonium polyacrylate but also a dispersant such as surfactant type dispersant, high-molecular dispersant or an acid or alkali which changes a surface zeta potential, thereby changing the adsorption state can change the selectivity ratio.

By the coexistence of planarity and uniformity brought by the above-described improvement in a selectivity ratio, it is possible to avoid the bad influence of nanotopology on a wafer substrate which has recently been a problem. Nanotopology is an unevenness of several mm to several cm in frequency and several tens to several hundreds nm in amplitude which a silicon substrate itself has (Second Chapter, Superprecision wafer surface control technology). This unevenness did not become a problem in the conventional standards, because of having a relatively long frequency and minute amplitude. In the polishing of a shallow-trench element isolation step which requires highly precise planarization, nanotopology is transferred to a polishing amount, thereby deteriorating uniformity. Standards including a reduction of nanotopology can be set, which however increases a manufacturing cost of a substrate. According to the present invention, however, by using a silicon nitride film as a stopper, it is possible to terminate polishing on the stopper film irrespective of the unevenness due to nanotopology, whereby worsening of uniformity can be avoided.

Not only when the different kinds of films exist but also when a homogeneous layer is polished as illustrated in FIG. 9, addition of a dispersant is effective for improving uniformity. This depends not on the improvement of selectivity but on another mechanism, that is, heightening of stability in the number of free abrasive grains, which will be described below.

Figure 11A:
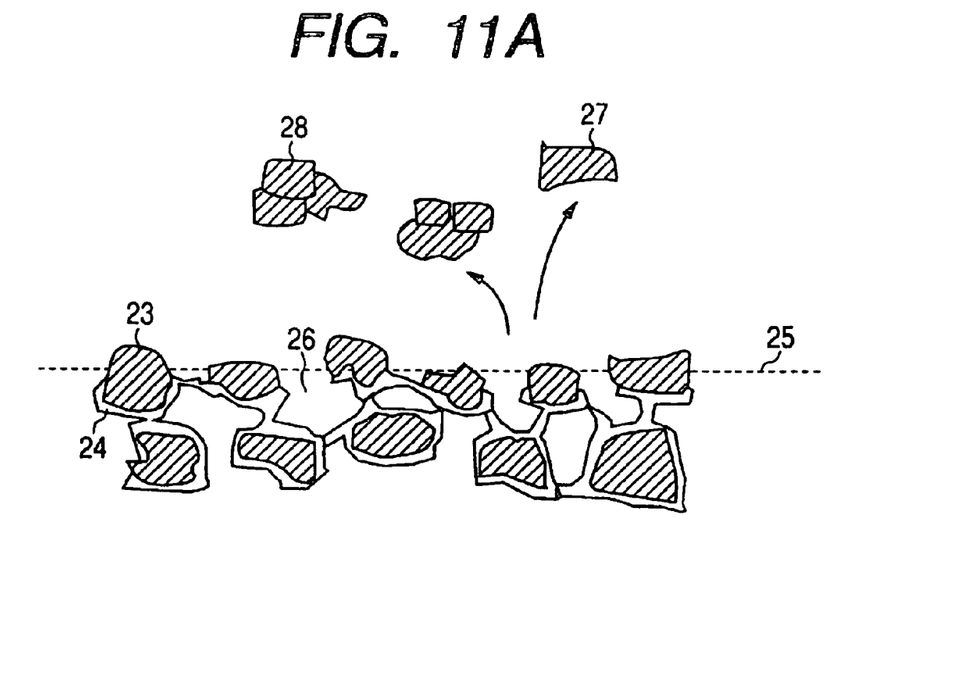
FIGS. 11A to 11B are schematic views illustrating the role of a dispersant.
Figure 11B:
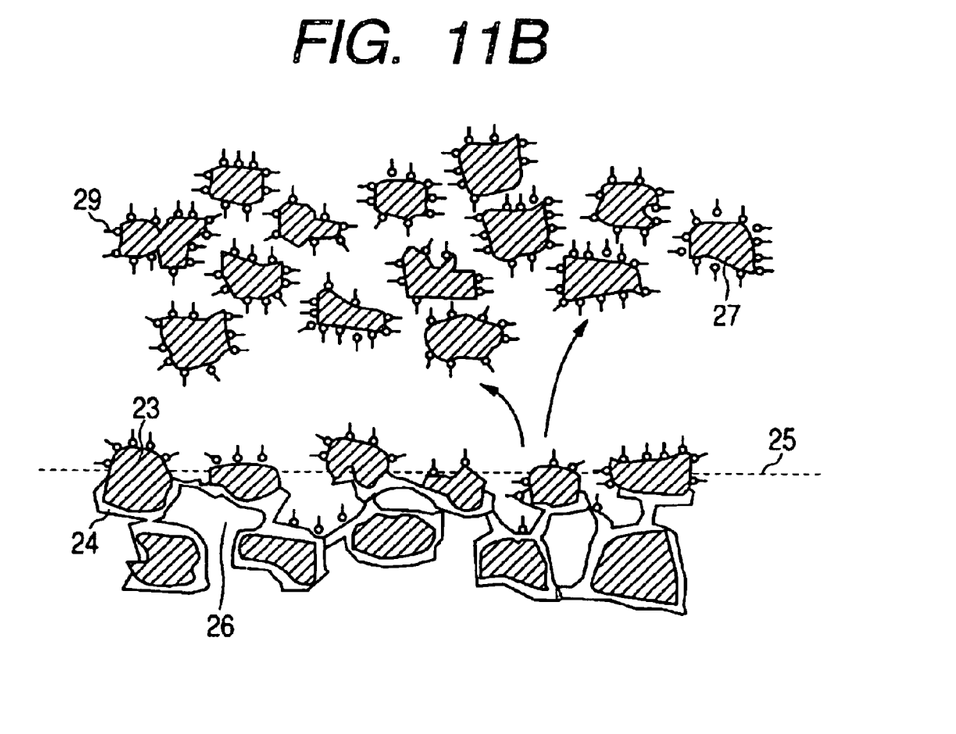

A mechanism of the addition of a dispersant for stabilizing the number of free abrasive grains will next be described based on FIGS. 11A to 11B. FIGS. 11A and 11B are enlarged schematic views of the surface of a grindstone viewed from the cross-sectional direction. The grindstone is constituted of abrasive grains 23, a resin 24 for binding the abrasive grains and pores 26. The abrasive grains can be classified, by its condition, into abrasive grains 23 (fixed abrasive grains) fixed in the grindstone and the abrasive grains 27 (free abrasive grains) released from the grindstone to the processing liquid. FIG. 11A is the state of the grindstone when deionized water is employed as a processing liquid. The free abrasive grains are small in number and they tend to form agglomerated abrasive grains 28 with another free abrasive grains. Effective number of free abrasive grains is therefore very small.

FIG. 11B is the state of a grindstone when a dispersant 29 is added to the processing liquid in order to increase the discharge amount of free abrasive grains. When a popularly-used anionic surfactant type dispersant is used, the dispersant molecules adsorb to the solid surface of abrasive grains, whereby the solid surface is negatively charged. By this charge, repulsion works between the abrasive grains or between the grindstone and abrasive grains, thereby improving dispersity. The surfactant intensively exists only on the interface between the abrasive grains or grindstone and the processing liquid so that effect appears only by the addition of a trace amount. The dispersant 29 promotes the liberation of abrasive grains from the surface of the grindstone, whereby the number of free abrasive grains 27 becomes larger compared with the state of FIG. 11A. The dispersant prevents easy agglomeration of abrasive grains, thereby increasing a specific surface area of free abrasive grains taking part in removal. Widening in the specific surface area of abrasive grains promotes reaction between the abrasive grains and a film to be removed, thereby increasing the effective number of abrasive grains particularly when chemical reaction on the surface of abrasive grains is important, for example, when a silicon dioxide film is polished by cerium dioxide.

When a concentration of free abrasive grains is low, a removal rate tends to fluctuate, because it largely depends on the concentration. In the present invention wherein a dispersant is added to increase the concentration of free abrasive grains sufficiently, processing can be carried out even in a region wherein dependence of the removal rate on the concentration of free abrasive grains is small. This makes it possible to stabilize the removal rate, and fluctuations in the removal rate can be suppressed to a low level even if the concentration of abrasive grains changes by time or space. In short, the uniformity and stability of polishing can be improved. By this mechanism, uniformity of a polishing amount can be improved even if only a homogeneous layer exists as illustrated in FIG. 9.

Many of dispersants have an interface activating function so that addition of it prevents easy adhesion of free abrasive grains to the inside wall of the apparatus, thereby decreasing the possibility of the particles contaminating a clean room. Adhesion amount of abrasive grains to the wafer surface after processing also decreases so that a washing load of a wafer can be relieved.

In the end, effects for a fabrication process of a semiconductor wafer available by the above-described improvement in selectivity and in removal rate will be described. A step for which the present invention exhibits its effect most is a step wherein polishing is stopped as soon as the different kinds of films are exposed and which requires high planarizing capacity, as the shallow-trench isolation step described in the above-described example. By selecting a proper dispersant capable of making a finally exposed film to serve as a stopper, polishing of a predetermined layer can be completed with good uniformity while using a grindstone having high planarizing capacity.

Specific examples of the effect available by the present invention include shortening of TAT and cost reduction by omission of an etch back step (formed of at least 7 steps of resist application, exposure to light, baking, inspection, dry etching, ashing and cleaning) which makes use of a reverse mask in a shallow-trench isolation step. In addition, owing to a sufficiently high selectivity relative to a stopper film such as silicon nitride film, the thickness of the stopper film can be designed to be thin. Even a stopper film having a large film stress such as nitride film can be formed thin so that stress-induced defects can be reduced. A dummy pattern such as tile pattern disposed in a wide area in order to make up for insufficient planarity becomes unnecessary, which increases design latitude.

What is claimed is:

1. A process for producing a semiconductor device comprising the steps of:
    using a grindstone formed of abrasive grains and a resin binder for binding and retaining the abrasive grains;
    feeding a dispersant-containing processing liquid to a surface of the grindstone, and
    polishing and planarizing the surface of a semiconductor wafer so as to expose at least two different thin films formed on the surface of the semiconductor wafer during a part or whole of processing time,
    wherein said grains have average grain size of 0.1–0.4 $\mu$m and at least 99% of said grains are in a range of grain size of 1 $\mu$m or less, and said processing liquid is free of abrasives, and
    wherein said dispersant enables to improve a polishing selectivity between said two different thin films.

2. A process according to claim 1, wherein said at least two different thin films include a film mainly containing silicon dioxide and a film mainly containing silicon nitride.

3. A process according to claim 1, wherein a concentration of the dispersant in the processing liquid is changed during processing for changing a polishing selectivity between said two different films.

4. A process according to claim 1, wherein at least 99% of the abrasive grains have a particle size of 0.001 $\mu$m or greater but not greater than 1 $\mu$m.

5. A process according to claim 1, wherein a surfactant is employed as the dispersant added to the processing liquid.

6. A process according to claim 1, wherein a polycarboxylate is employed as the dispersant added to the processing liquid.

7. A process according to claim 1, wherein ammonium polyacrylate is used as the polycarboxylate.

8. A process according to claim 7, wherein the concentration of ammonium polyacrylate ranges from 0.05 wt. % to 5 wt. %.

9. A process according to claim 7, wherein ammonium polyacrylate has a molecular weight ranging from 100 to 200000.

10. A process according to claim 1, wherein the grindstone including, cerium dioxide, aluminum oxide, silica, zirconium oxide, manganese oxide, titanium oxide or magnesium oxide or mixture thereof as the abrasive grains is employed.

11. A process for producing a semiconductor device, comprising the steps of:
    using a grindstone formed of abrasive grains and a resin binder for binding and retaining the abrasive grains;
    feeding a dispersant-containing processing liquid to the surface of the grindstone, and
    polishing and planarizing the surface of a semiconductor wafer over which a silicon nitride film and a silicon oxide film have been stacked one after another,
    wherein said grains have average grain size of 0.1–0.4 $\mu$m and at least 99% of said grains are in a range of grain size of 1 $\mu$m or less, and said processing liquid is free of abrasives, and
    wherein the dispersant has a concentration permitting a removal rate ratio of the silicon oxide film not less than 20 relative to the silicon nitride film.

12. A process according to claim 11, wherein the concentration of the dispersant ranges from 1 wt. % to 4 wt. %.

13. A process according to claim 11, wherein any one of ammonium polyacrylate, polycarboxylates, polyoxyethylene derivatives, phosphate condensates, lignin sulfonate, aromatic sulfonate formalin condensates and alkylamines is used as the dispersant.

14. A process for fabricating a semiconductor device, comprising the steps of:
    using a grindstone formed of abrasive grains and a resin binder for binding and retaining the abrasive grains;
    feeding a dispersant-containing processing liquid to the surface of the grindstone, and
    polishing and planarizing the surface of a semiconductor wafer over which a silicon nitride film and a silicon oxide film have been stacked one after another,
    wherein said grains have average grain size of 0.1–0.4 $\mu$m and at least 99% of said grains are in a range of grain size of 1 $\mu$m or less, and said processing liquid is free of abrasives, and
    wherein the dispersant is fed at a low concentration at an initial stage of polishing for high removal rate of said silicon oxide, followed by an increase in the concentration for high selectivity of removal rate of said silicon oxide to said silicon nitride.

15. A process according to claim 14, wherein the concentration of the dispersant is 1% or less at the initial stage and then it is increased to 1.5% or greater.

16. A process for fabricating a semiconductor device, comprising the steps of:
    using a grindstone formed of abrasive gains and a resin binder for binding and retaining the abrasive grains;
    feeding a dispersant containing processing liquid to the surface of the grindstone, and polishing and planarizing the surface of a semiconductor wafer over which a silicon nitride film and a silicon oxide film have been stacked one after another, wherein said grains have average grain size of 0.1–0.4 μm and at least 99% of said grains are in a range of grain size of 1 μm or less, and said processing liquid is free of abrasives, and wherein the processing liquid is supplied while setting the concentration of the dispersant within a range permitting a removal rate of the silicon nitride film once decreased to a low level and maintained at substantially the same low level and a removal rate of the silicon oxide film once increased to a high level and maintained at substantially the same high level.

17. A process according to claim 16, wherein the processing liquid is supplied while setting the concentration of the dispersant within a range permitting a removal rate of the silicon nitride film once decreased to a low level and maintained at substantially the same low level and a removal rate of the silicon oxide film decreased from the maximum value.

18. A process according to claim 16, wherein the dispersant has a lowered viscosity.

19. A production process of a semiconductor device, comprising at least the following steps:

forming a silicon nitride film over a semiconductor substrate and then forming a trench for isolation region in the semiconductor substrate;

forming an insulating film over said trench for isolation region and said silicon nitride film, and using a grindstone formed of abrasive grains and a resin binder for binding and retaining the abrasive grains feeding a dispersant containing processing liquid to the surface of the grindstone, polishing the surface of the semiconductor substrate, thereby planarizing said insulating film, and leaving the insulating film only in said trench for isolation region, and removing the silicon nitride film from the substrate in a region other than the isolation region, wherein said grains have average grain size of 0.1–0.4 μm and at least 99% of said grains are in a range of grain size of 1 μm or less, and said processing liquid is free of abrasives, and wherein said dispersant enables to improve a polishing selectivity between said insulating film and silicon nitride film.

20. A process according to claim 19, wherein in the step for planarizing said insulating film and removing the silicon nitride film by polishing, the surface of the semiconductor substrate is polished using the processing liquid having a dispersant concentration permitting a removal rate ratio of the silicon oxide film not less than 20 relative to the silicon nitride film.

21. A process according to claim 19, wherein in the step for planarizing said insulating film and removing the silicon nitride film by polishing, the surface of the semiconductor substrate is polished by supplying the processing liquid having a dispersant concentration set low at an initial stage of polishing and then supplying the processing liquid having an increased concentration.

22. A process according to claim 19, wherein in the step for planarizing said insulating film and removing the silicon nitride film by polishing, the surface of the semiconductor substrate is polished by feeding the processing liquid having a dispersant concentration within a range permitting a removal rate of the silicon nitride film once decreased to a low level and maintained at substantially the same low level and a removal rate of the silicon oxide film once increased to a high level and maintained at substantially the same high level.

* * * * *